(12) United States Patent
Kossor

(10) Patent No.: US 6,759,902 B2
(45) Date of Patent: Jul. 6, 2004

(54) SINGLE-DETECTOR AUTOMATIC GAIN CONTROL CIRCUIT

(75) Inventor: Michael G. Kossor, Kenilworth, NJ (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/391,897

(22) Filed: Mar. 19, 2003

(65) Prior Publication Data

US 2003/0179040 A1 Sep. 25, 2003

Related U.S. Application Data

(60) Provisional application No. 60/367,403, filed on Mar. 25, 2002.

(51) Int. Cl.[7] .................................................. H03G 3/20
(52) U.S. Cl. ........................ 330/136; 330/279; 455/126
(58) Field of Search ................................. 330/136, 129, 330/279, 298, 207 P, 289; 455/126

(56) References Cited

U.S. PATENT DOCUMENTS 5,319,804 A * 6/1994 Matsumoto et al. ........ 455/126
5,732,334 A * 3/1998 Miyake ...................... 455/126
5,854,971 A * 12/1998 Nagoya et al. ............. 455/126
5,963,090 A * 10/1999 Fukuchi ...................... 330/149
6,489,846 B2 * 12/2002 Hatsugai ..................... 330/149

* cited by examiner

*Primary Examiner*—Henry Choe
(74) *Attorney, Agent, or Firm*—Steve Mendelsohn (57) ABSTRACT

An automatic gain control (AGC) circuit for an RF amplifier (or other type of signal-processing module) has a single, switched, RF detector that selectively detects the instantaneous power level of either the sampled RF input signal or the sampled (and optionally attenuated) RF output signal. A processor uses the detected input and output power levels to generate control signals for a variable (e.g., voltage-controlled) attenuator that attenuates the RF input signal prior to being applied to the input of the RF amplifier. The processor is designed (e.g., programmed) to control the variable attenuator to maintain a constant gain between the input and output terminals of the AGC circuit. In addition to this closed-loop mode of operation, the AGC circuit may also have a temperature sensor, where the processor controls the variable attenuator in an open-loop mode of operation based on the temperature of the RF amplifier.

20 Claims, 4 Drawing Sheets

SINGLE-DETECTOR AUTOMATIC GAIN CONTROL CIRCUIT

CROSS-REFERENCE TO RELATED APPLICATIONS

This application claims the benefit of the filing date of U.S. provisional application No. 60/367,403, filed on Mar. 25, 2002.

FIELD OF THE INVENTION

The present invention relates to signal processing, and, in particular, to automatic gain control circuits for amplifiers, such as RF amplifiers.

BACKGROUND OF THE INVENTION

An important parameter associated with radio-frequency (RF) amplifiers is the amplification factor or gain. Numerous methods have been devised to provide automatic gain control (AGC) of RF amplifiers that function to maintain constant gain despite changes in operating parameters, such as temperature, voltage, signal level, and component age, to name a few.

Closed-loop AGC

Figure 1:
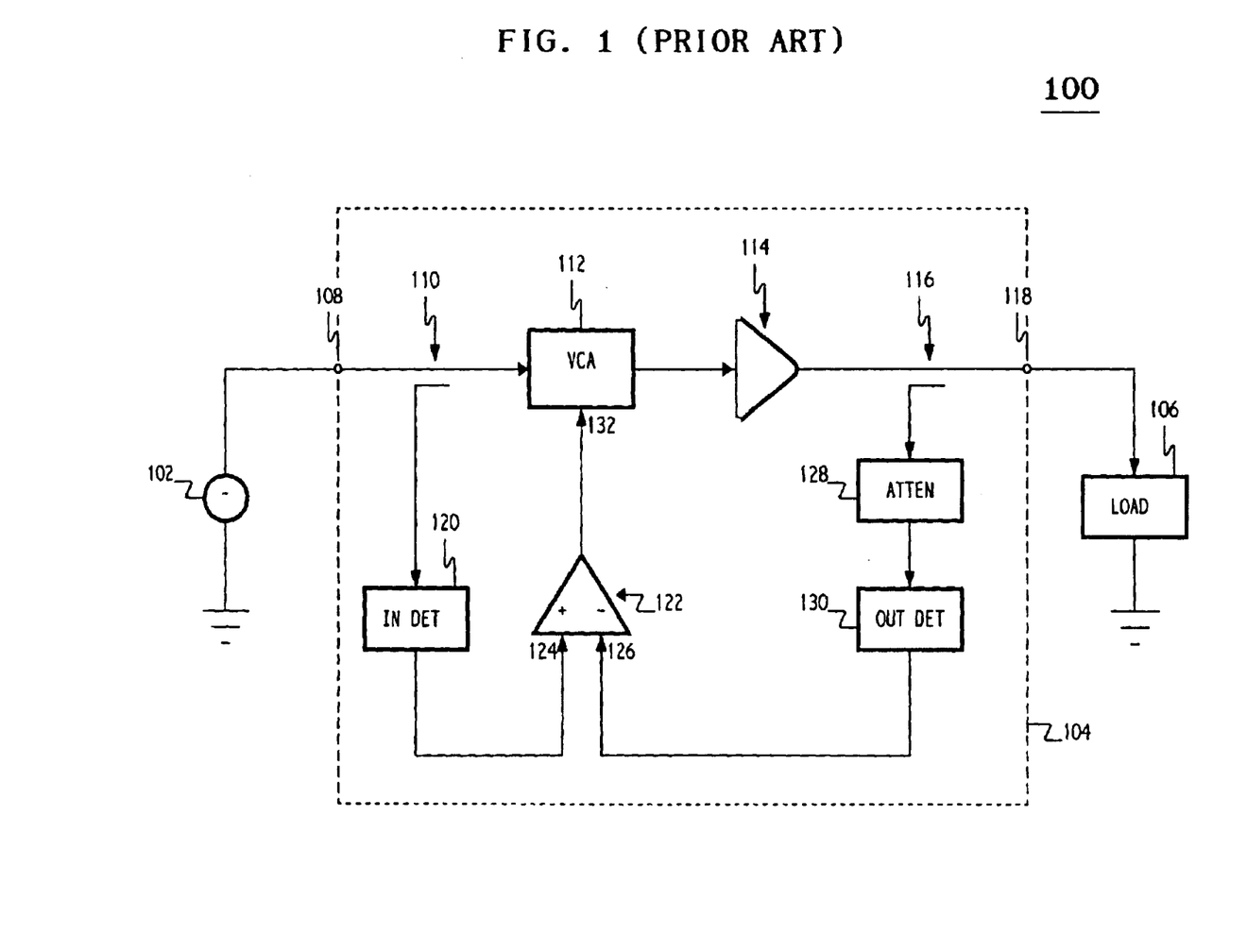
FIG. 1 is a block diagram of a closed-loop AGC system of the prior art.

FIG. 1 is a block diagram of a closed-loop AGC system 100 of the prior art. AGC system 100 has an RF signal generator 102, closed-loop AGC circuit 104, and load 106. The objective of AGC system 100 is to amplify the RF signal produced by signal generator 102 by a fixed amount and deliver the amplified signal to load 106 (e.g., a resistor).

In particular, the RF signal from generator 102 is input to AGC circuit 104 at input terminal 108. The RF input signal flows through directional coupler 110 and then to voltage-controlled attenuator (VCA) 112. The purpose of VCA 112 is to vary the level of the RF input signal. The signal is then routed from the output of VCA 112 to the input of RF amplifier 114. The output of RF amplifier 114 is routed through output coupler 116 and then to output terminal 118, which is connected to load 106.

The signal gain G between terminals 108 and 118 of AGC circuit 104 is determined by G=A−B, where A is the gain of amplifier 114 (e.g., in dB) and B is the loss of VCA 112 (e.g., in dB). As the value of gain A of RF amplifier 114 changes in response to various operating parameters, the value of loss B of VCA 112 is adjusted accordingly to maintain the overall gain between terminals 108 and 118 constant.

The control signal to automatically maintain VCA 112 at the proper level of insertion loss is provided by elements within closed-loop AGC circuit 104. In particular, the input power level of the RF signal sampled by directional coupler 110 is detected by input detector 120 before being routed to the positive input terminal 124 of differential amplifier 122. The amplified RF output signal is sampled by directional coupler 116, attenuated (by approximately −A dB) by passive attenuator 128 (e.g., three resistors) before being detected by output detector 130. The attenuated and detected version of the RF output signal sample is then routed to the negative input terminal 126 of differential amplifier 122. The output of differential amplifier 122 will be set to a specific DC voltage Vr depending upon the difference between the sampled input power level present on positive input terminal 124 and the sampled output power level present on negative input terminal 126. The output of differential amplifier 122 is routed to the control voltage input 132 of VCA 112 to control the level of attenuation (i.e., inverse gain) applied by VCA 112 to the RF input signal received from RF generator 102.

For the following description of AGC action, the power level of the RF input signal received from RF generator 102 is assumed to remain constant. Environmental changes, such as elevated temperature, will cause the gain of RF amplifier 114 to decrease, resulting in a decrease in the power level of the RF output signal at terminal 118. Accordingly, the attenuated and detected sample of the RF output signal presented to the negative input terminal of differential amplifier 122 will also decrease in value. The detected sample of the RF input signal presented to the positive input terminal of differential amplifier 122 will remain the same since the RF input signal is assumed to be held constant. As such, the output of differential amplifier 122 will increase in voltage, which increases the voltage on the control voltage input of VCA 112. The transfer characteristics of VCA 112 are designed such that an increase in voltage on the control voltage input results in a decrease in the loss value B. The resulting decrease of attenuation of VCA 112 causes the input power level presented to the input of RF amplifier 114 to increase, which in turn causes the RF power level presented to the RF output signal to increase at output terminal 118. The RF output power of amplifier 114 will continue to increase until the sampled, attenuated, and detected version of the RF output signal presented to negative input terminal 126 of differential amplifier 122 equals the sampled and detected version of the RF input signal presented to positive input terminal 124 of differential amplifier 122. The output voltage of differential amplifier 122 will then be set to a value lower than the original value Vr, which restores the original gain between terminals 108 and 118 of AGC circuit 104.

AGC operation is similar in response to environmental changes or other factors that cause the gain of RF amplifier 114 to increase, such as low-temperature operation. In this case, the sampled, attenuated, and detected version of the RF output signal increases in value even though the RF input signal power level remains constant. The rising value of the sampled, attenuated, and detected version of the RF output signal presented to negative input terminal 126 of differential amplifier 122 causes the output of differential amplifier 122 to decrease in voltage. This decrease in voltage on VCA control voltage input 132 causes VCA 112 to increase its level of attenuation B. This increase in attenuation causes the RF signal power level presented to the input of RF amplifier 114 to decrease, which in turn causes the RF output signal level present at output terminal 118 to decrease in power. The trend continues until the sampled, attenuated, and detected version of the output signal presented to negative input terminal 126 of differential amplifier 122 equals the sampled and detected version of the input signal presented to positive input terminal 124 of differential amplifier 122. The output voltage of differential amplifier 122 will now be set to a value higher than the original value Vr, which restores the original gain between terminals 108 and 118 of AGC circuit 104.

Closed-loop AGC circuit 104 can also be used to maintain the gain between terminals 108 and 118 due to change in the gain of RF amplifier 114 resulting from input signal level changes. Large-signal amplifiers implemented with bipolar devices and operating as Class AB devices for improved efficiency typically increase in gain as the input signal level is increased. This gain expansion causes the RF output signal to further increase beyond the expected amplifier amplification factor of A−B. Further increasing the input signal level (beyond the so-called gain compression point) eventually causes the RF amplifier gain to decrease or compress below the expected amplifier factor A as is well known to those skilled in the art.

Large-signal RF amplifiers implemented with new technology devices, such as laterally diffused metal oxide silicon (LDMOS) transistors, exhibit significantly improved linearity over the same dynamic range of input signal. As such, the gain of RF amplifier 114 remains substantially constant regardless of input signal level up until the gain compression point. The issue of gain compression is not of concern for many modern large-signal RF amplifier applications involving digital modulation. In such cases, RF amplifier 114 is sized such that the maximum RF signal output is well below the 1-dB gain compression point. Hence, closed-loop AGC operation as depicted in FIG. 1 is not necessary to control gain expansion or gain compression of such LDMOS RF amplifiers in many digital modulation applications such as TDMA, CDMA, UMTS, or other well-known digital modulation formats.

On the other hand, employing closed-loop AGC on RF amplifiers in digital modulation applications presents special challenges, such as stability of the control loop over widely varying RF input signals or in the absence of RF input signals. If the loop operates too fast, then AGC operation may function to alter the amplitude characteristics of the digitally modulated signal causing distortion of the signal intelligence. If the loop operates too slow, then gain accuracy might not be met over the dynamic range of the input signal. Gain accuracy also depends on other factors such as how well input detector 120 matches output detector 130 and how they track over temperature.

Open-loop AGC

Figure 2:
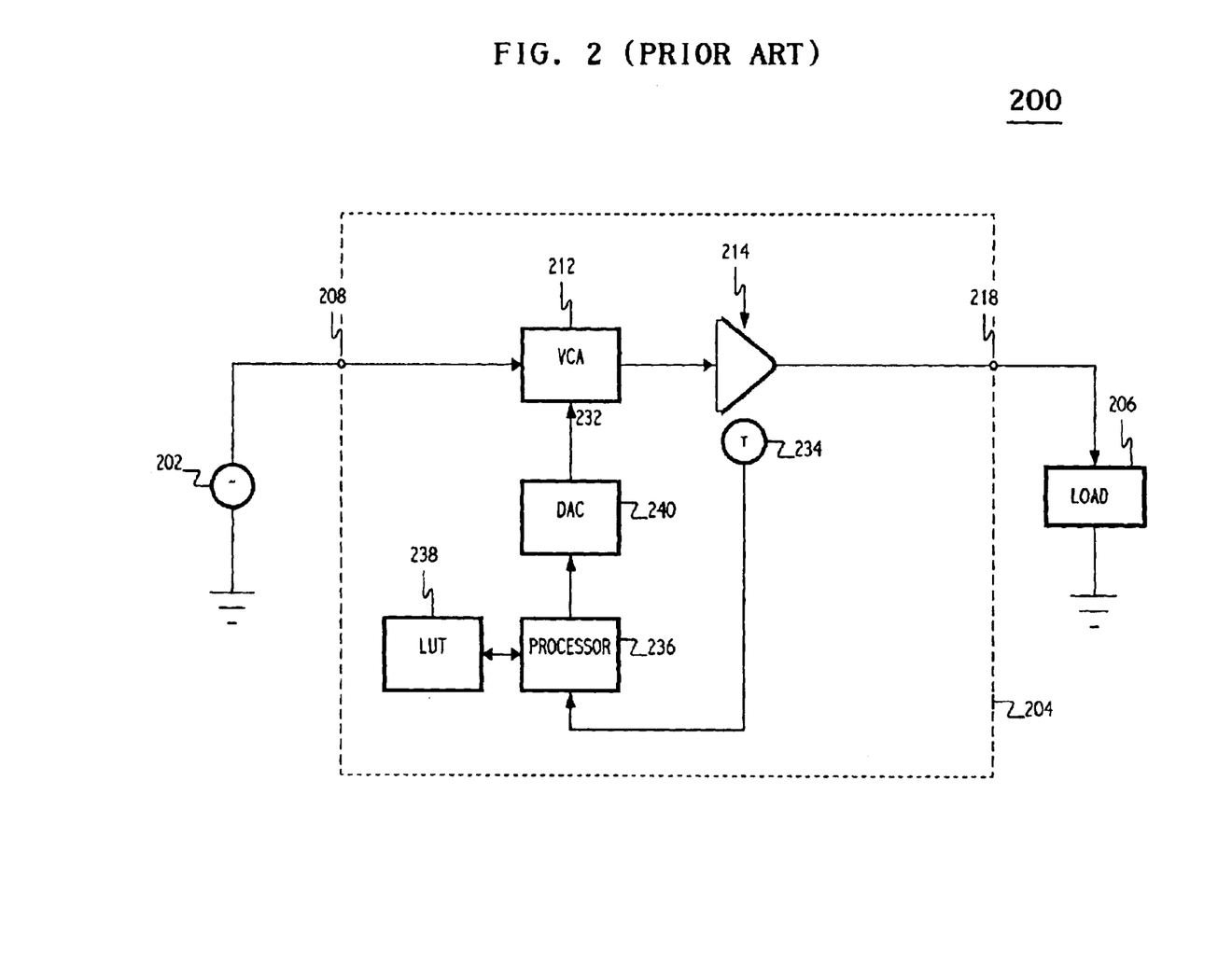
FIG. 2 is a block diagram of an open-loop AGC system of the prior art.

Modern amplifiers utilizing LDMOS technology in digital modulation applications still typically utilize some means of automatic gain control to maintain gain over temperature. FIG. 2 shows a block diagram of open-loop AGC system 200 of the prior art. Like closed-loop AGC system 100 of FIG. 1, open-loop AGC system 200 has an AGC circuit 204 connected between an RF signal generator 202 and a load 206 to maintain constant amplification of the RF input signal received from generator 202 at input terminal 208 for application to load 206 at output terminal 218. Moreover, like AGC circuit 104, AGC circuit 204 has a voltage-controlled attenuator 212 and an RF amplifier 214. Unlike AGC circuit 104, however, AGC circuit 204 has a temperature sensor 234 adapted to sense the temperature of amplifier 214. The sensed temperature signals are presented to microprocessor 236, which can access data stored in look-up table (LUT) 238 and generate an output signal that is converted into a voltage control signal by digital-to-analog converter (DAC) 240 for application to control voltage input 232 of VCA 212.

In operation, microprocessor 236 monitors the operating temperature of RF amplifier 214 via temperature sensor 234. As temperature changes, microprocessor 236 reads correction data from LUT 238 and uses the correction data to alter the voltage output of DAC 240. The output voltage of DAC 240 serves as input to VCA control voltage input 232, which in turn controls the RF signal level input to RF amplifier 214. Microprocessor 236 can thus control DAC 240 to increase the VCA control voltage as temperature increases to minimize the gain change between terminals 208 and 218. Likewise, microprocessor 236 can control DAC 240 to decrease the VCA control voltage as temperature decreases to minimize the gain change between terminals 208 and 218.

This open-loop method of automatic gain control requires detailed characterization of several amplifiers over temperature to determine the average behavior to determine the correction voltage necessary to be applied to VCA control voltage input 232 to maintain constant gain. This data is used as the basis for LUT 238.

The open-loop method of FIG. 2 can be simpler and less expensive to implement than the closed-loop method of FIG. 1 considering that many modern, large-signal amplifiers already employ microprocessors, look-up table memory, and digital-to-analog converters in support of other amplifier functions. The principal disadvantages associated with this open-loop method are the lack of unit-specific accuracy. Gain correction is done based on an average of similar amplifiers that takes a great deal of time and effort to obtain. Moreover, correction is done open loop without actually knowing what the RF output signal power level is. These factors limit the gain accuracy that can be maintained over temperature.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 3:
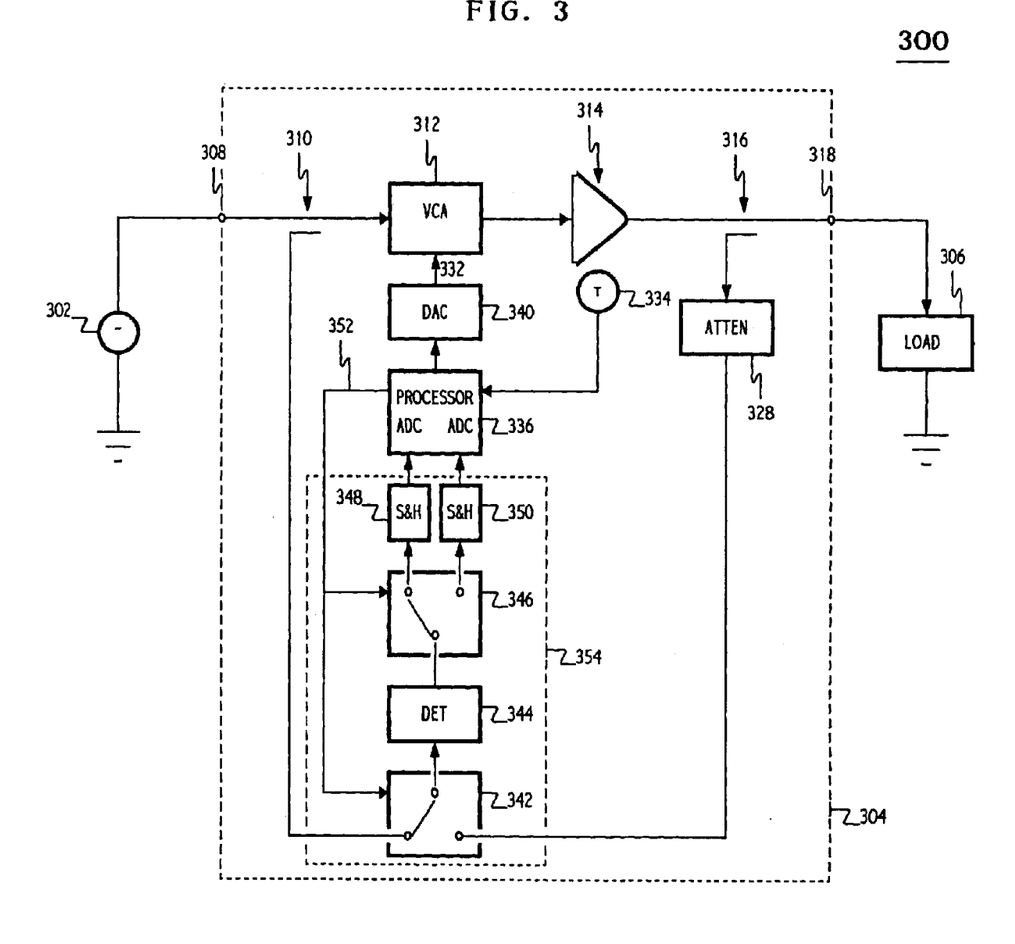
FIG. 3 is a block diagram of an AGC system, according to one embodiment of the present invention.

FIG. 3 is a block diagram of AGC system 300, according to one embodiment of the present invention. Like AGC systems 100 and 200 of FIGS. 1 and 2, AGC system 300 has an AGC circuit 304 connected between an RF signal generator 302 and a load 306 to maintain constant amplification of the RF input signal received from generator 302 at input terminal 308 for application to load 306 at output terminal 318. Moreover, like AGC circuits 104 and 204, AGC circuit 304 has a voltage-controlled attenuator 312 and an RF amplifier 314.

In addition to VCA 312 and RF amplifier 314, AGC circuit 304 has input coupler 310 and output coupler 316, which sample the RF input and output signals, respectively, where the RF output signal sample is attenuated by passive attenuator 328. The RF input signal sample and the attenuated RF output signal sample are presented to the two input terminals of (2×1) RF switch 342, which selects and presents one of the two RF signal samples to a single RF detector 344. The detected signal sample from detector 344 is presented to the input terminal of (1×2) analog switch 346, which selectively presents the detected signal sample to either input sample-and-hold (S&H) circuit 348 or output S&H circuit 350. The outputs of S&H circuits 348 and 350 are both applied to processor 336, whose output is converted to an analog voltage control signal by DAC 340 and applied to control voltage input 332 of VCA 312. The states of switches 342 and 346 are controlled by a clock signal 352 from processor 336. RF switch 342, RF detector 344, analog switch 346, and S&H circuits 348 and 350 may be said to form switched detector circuitry 354.

In addition, AGC circuit 304 has temperature sensor 334, which senses the temperature of amplifier 314 and presents sensed temperature signals to processor 336.

In operation, AGC circuit 304 maintains constant gain between input terminal 308 and output terminal 318 in the presence of operating parameter changes other than input signal power level (dynamic range). RF amplifier 314 is assumed to be linear such as provided by LDMOS technology in which gain control over input signal dynamic range is not necessary.

AGC circuit 304 is capable of operating in either a closed-loop mode or an open-loop mode. In the closed-loop mode of operation, RF detector 344 alternately detects the RF power level of the RF input signal sample from input coupler 310 and the attenuated RF output signal sample from attenuator 328 via RF switch 342. Analog switch 346 is switched in sync with RF switch 342. With the states of RF switch 342 and analog switch 346 as shown in FIG. 3, the instantaneous RF power level of the RF input signal sample detected by RF detector 344 is stored in input S&H circuit 348. The states of the switches then change to their other positions, and the instantaneous RF power level of the attenuated RF output signal sample detected by RF detector 344 is stored in output S&H circuit 350.

Processor 336 alternately reads input S&H circuit 348 then output S&H circuit 350 via analog-to-digital converter (ADC) input pins of processor 336. The difference in voltage values between these values set to a specific value Vr, which depends upon the properties of input coupler 310, output coupler 316, passive attenuator 328, and any internal offset added or subtracted to the difference. The numerical value of Vr is converted to an analog voltage by DAC 340. The output of DAC 340 is then used to drive control voltage input 332 of VCA 312, which functions to set the attenuation level between the input and output of VCA 312.

Changes in temperature or other parameters that cause the gain of RF amplifier 314 to increase or decrease will also cause the detected RF signal level presented to output S&H circuit 350 to increase or decrease in value. Processor 336 functions to alter the value of Vr, and hence the signal at VCA control voltage input 332, as necessary to increase or decrease the attenuation level of VCA 312 such that the signal from output S&H circuit 350 maintains a fixed relationship to the signal from input S&H circuit 348, thus maintaining constant RF gain between terminals 308 and 318 as is desired. In other words, the processor controls the value of Vr to maintain the difference between the input signal and the output signal at a constant value selected by the user, where the constant value could be, but does not have to be zero. Proper operation of the AGC system preferably involves the time constant of the sample-and-hold circuits to be longer than the input/output RF detector switching rate.

In the absence of an RF input signal of sufficient magnitude (e.g., when the instantaneous RF power level of the RF input signal sample in input S&H circuit 348 is less than a specified threshold value), processor 336 can either hold steady the last value of Vr or alter the value of Vr by employing the open-loop mode of operation, which relies on the operating temperature from temperature sensor 334 and predetermined look-up table data (not shown) in a manner similar to that described in the context of open-loop AGC circuit 204 of FIG. 2. Closed-loop AGC operation can commence when the RF input signal returns to normal operating levels.

Processor 336 can also be programmed to ensure that the AGC circuit remains within safe operating limits by bounding the minimum and maximum attenuations of VCA 312 by limiting the maximum, single VCA control voltage step change between the input and output sample intervals.

Because only one RF detector is needed, the present invention can be implemented at a lower cost than closed-loop AGC circuit 104 of FIG. 1. The use of a single RF detector also eliminates the inaccuracy caused by differences between the input and output detectors of AGC circuit 104 and how well they track over temperature. Less circuitry can also provide higher reliability and less printed circuit board real estate used to implement AGC circuits of the present invention as compared to prior-art closed-loop AGC circuits.

Figure 4:
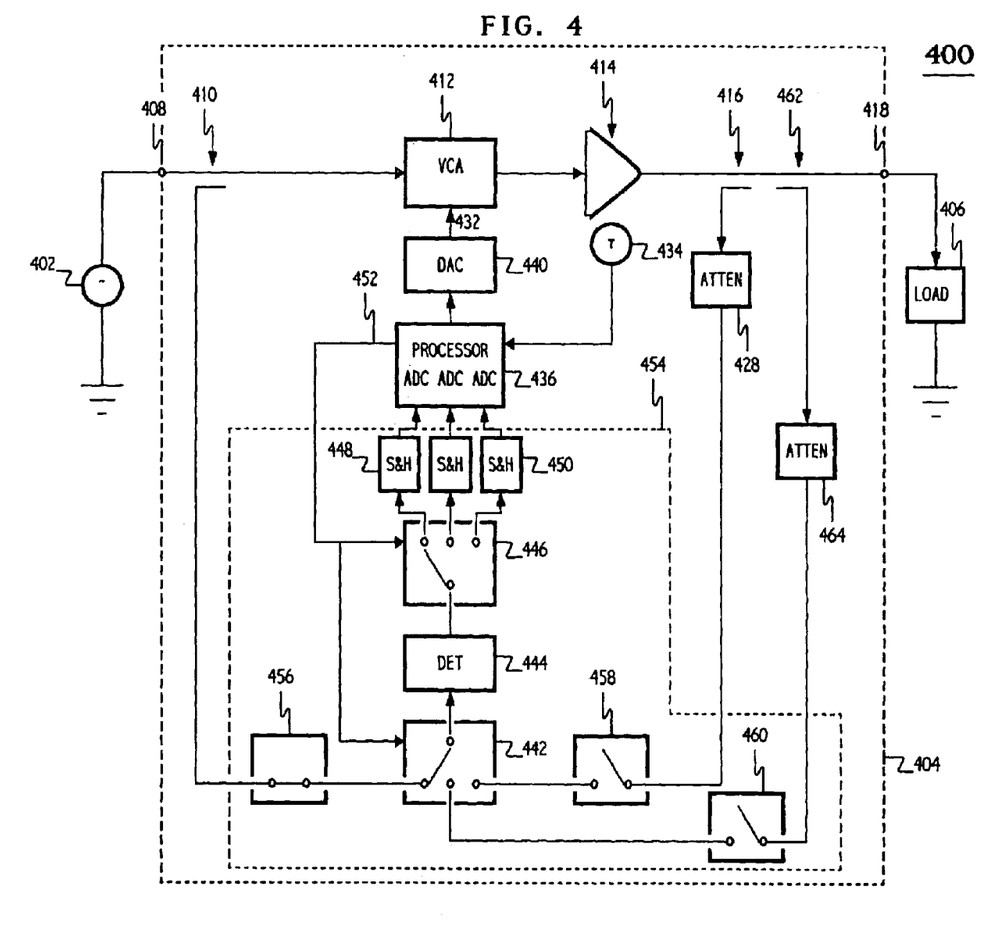
FIG. 4 is a block diagram of an AGC system, according to another embodiment of the present invention.

FIG. 4 is a block diagram of AGC system 400, according to another embodiment of the present invention. Elements 402–454 of AGC system 400 are analogous to elements 302–354 of AGC system 300 of FIG. 3. Unlike (2×1) RF switch 342, RF switch 442 is a (3×1) switch. Similarly, unlike (1×2) analog switch 346, analog switch 446 is a (1×3) switch. In addition to elements 442–450, switched detector circuitry 454 also includes single-pole, single-throw (SPST) switches 456–460 and an additional sample-and-hold circuit between S&H circuits 448 and 450. Furthermore, AGC circuit 404 includes directional coupler 462 and passive attenuator 464. Although not shown in FIG. 4, the states of SPST switches 456–460 are preferably controlled using the same clock signal 452 that controls the states of switches 442 and 446.

Test results for circuitry based on AGC system 300 of FIG. 3 indicated that, for certain applications, AGC circuit 304 was not able to maintain a constant gain with sufficient accuracy over certain frequencies. The root cause was identified to be limited isolation of RF switch 342. In particular, typical isolation numbers between the input and output RF samples at RF switch 342 were 35 to 40 dB. As a result, some of the output RF sample would "leak" or couple into the input RF sample causing error in the true RF input sample value, causing the gain (i.e., Pout/Pin) to be in error.

AGC system 400 addresses this problem by adding non-reflective, RF SPST switches 456 and 458 in series with the input and output samples, respectively. In particular, series input SPST switch 456 is inserted between coupler 410 and RF switch 442, and series output SPST switch 458 is inserted between attenuator 428 and RF switch 442.

In operation, when RF switch 442 is in the input sample position (from coupler 410), input SPST switch 456 is closed, while output SPST switch 458 is open. Opening output SPST switch 458 provides an additional 40 dB of isolation for a total isolation between the input and output RF samples of about 80 dB. Likewise, when RF switch 442 is in the output sample position (from attenuator 428), output SPST switch 458 is closed, while input SPST switch 456 is open, again providing about 80 dB of isolation between the input and output RF samples.

Each of SPST switches 456 and 458 is preferably designed such that, when the switch is open, all inputs see about a 50-Ohm impedance. Hence, the non-reflective nature of these switches. This compares to a typical, reflective switch, which would present a high impedance (greater than about 1 meg Ohm) to the off terminals when open.

As mentioned above, additional differences between AGC system 300 and AGC system 400 are the inclusion of directional coupler 462, attenuator 464, and SPST switch 460 and the use of three-position switches for RF switch 442 and analog switch 446. These elements enable processor to monitor the status of RF power reflected from load 406.

In particular, directional coupler 462, samples power in the reflected direction, ignoring the forward power. This reflected power sample is attenuated as needed by attenuator 464 and routed through RF SPST switch 460 (to improve isolation as described above) before entering the third terminal on RF switch 442. Although directional coupler 462 is shown positioned between attenuator 416 and output terminal 418, in general, it could be positioned anywhere after amplifier 414 and before load 406 to sample the reflected signal power.

With such a configuration, processor 436 can monitor both the gain (i.e., Pout/Pin) and the reflected power (i.e., Pref/Pout) with a single RF detector. Since both quantities are based on measurements taken with a single detector, they may be more accurate than similar quantities taken with three distinct detectors.

This method of AGC and monitoring reflected power ratio (sometimes referred to as VSWR) is particularly useful in constant-envelop modulation systems such as GSM. Use on systems in which the amplitude envelope is changing rapidly might place restrictions on how fast the input-to-output (and output-to-reflected) data is collected.

Instead of using directional coupler 462, in an alternative embodiment, the reflected power could be monitored using a circulator after amplifier 414 and before load 406. A circulator is a three-terminal device that would have its input terminal connected to receive RF power from amplifier 414, its output terminal connected to transmit RF power towards load 406, and its third terminal connected to transmit RF power towards an RF attenuator, such as attenuator 464.

In operation, the circulator would route RF power from amplifier 414 towards load 406 with little loss. Any reflected power from load 406 would be routed by the circulator's third terminal towards attenuator 464 for the purpose of monitoring reflected power. Ideally, none of the reflected power from load 406 reaches the circulator's input terminal.

Alternative Embodiments

Although the following alternative embodiments are described in the context of AGC circuit 300 of FIG. 3, it will be understood that they can similarly be applied to AGC circuit 400 of FIG. 4.

Although RF amplifier 314 is depicted in FIG. 3 as being part of AGC circuit 304, the present invention can also be implemented in the context of AGC circuits in which the amplifier is not considered to be part of the AGC circuitry. In general, the RF amplifier may be implemented separate from the AGC circuitry (e.g., on a separate chip or even a separate board) or together with the AGC circuitry (e.g., as part of a single integrated circuit).

Processor 336 of AGC circuit 304 may be any suitable signal-processing engine, including a programmable microprocessor, an application-specific integrated circuit (ASIC), a field-programmable gate array (FPGA), a programmable logic device (PLD), or the like.

The present invention has been described in the context of AGC circuit 304, which supports both closed-loop and open-loop modes of operation. Alternatively, the present invention can be implemented as AGC circuits that do not have a temperature sensor, such as temperature sensor 334, and do not support the open-loop mode of operation. The present invention could also be implemented as AGC circuits that support types of open-loop modes of operation in addition to or other than a temperature-based mode.

The present invention has been described in the context of an AGC circuit having a voltage-controlled attenuator, such as VCA 312 of FIG. 3. Alternatively, AGC circuits of the present invention can be implemented using other types of variable attenuators, such as current-controlled attenuators or digitally controlled attenuators.

The present invention has been described in the context of an AGC circuit having a passive attenuator, such as attenuator 328 of FIG. 3, in the feedback path. Depending on the power level of the output signal, AGC circuits of the present invention might be able to be implemented without a discrete, analog attenuator in the feedback path. For example, processor 336 could be designed (e.g., programmed) to apply appropriate attenuation in the digital domain to the data it receives from the feedback path corresponding to the output signal.

The present invention has been described in the context of AGC circuit 304 of FIG. 3 in which the output from detector 344 is applied to analog switch 346, which selectively presents the detected signal sample from detector 344 to either input S&H circuit 348 or output S&H circuit 350, both of which present their outputs to processor 336. In this embodiment, the states of both switches 342 and 346 are controlled by clock signal 352 from processor 336. Alternatively, the present invention can be implemented as an AGC circuit without elements similar to analog switch 346 and S&H circuits 348 and 350, in which the output of detector 344 is presented directly to processor 336 (perhaps through an intervening analog-to-digital converter (ADC)). In that case, processor 336 can be designed (e.g., programmed) to track the state of RF switch 342 and thereby determine when the detected signal sample from detector 344 corresponds to the RF input signal sample and when the detected signal sample corresponds to the RF output signal sample.

The present invention has been described in the context of an AGC circuit that provides automatic gain control for an RF amplifier, such as RF amplifier 314 of FIG. 3. Alternatively, the present invention can be implemented in the context of AGC circuits that provide automatic gain control for signal-processing modules other than RF amplifiers, such as non-RF amplifiers, environment-dependent attenuators, buffers, and other modules that process (e.g., amplify, buffer, or attenuate) signals. Instead of using two discrete process detectors (input and output) to sample input and output signals for a feedback system, implementation of the present invention would involve the use of a single, shared process detector.

The present invention has been described in the context of an AGC system that does not provide any correction for non-linearities in its signal-processing module, such as RF amplifier 314 of FIG. 3. Alternatively AGC circuits of the present invention can be implemented in the context of circuitry that provides pre-distortion and/or feed-forward distortion to linearize the signal-processing module.

The present invention has been described in the context of AGC system 300 of FIG. 3, in which an analog RF input signal is amplified. The present invention is not limited to such an embodiment for such an application. In other applications, the present invention may be applied to amplify input signals other than analog RF signals, such as analog signals at other frequencies and/or digital signals.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An automatic gain control (AGC) circuit for a signal-processing module, the AGC circuit comprising:
   a variable attenuator adapted to vary the level of an input signal and apply the attenuated input signal to the signal-processing module, which generates an output signal;
   switched detector circuitry adapted to selectively detect either a sample of the input signal or a sample of the output signal; and
   a processor adapted to generate a control signal based on the detected input signal sample and the detected output signal sample, wherein the control signal adjusts the attenuation of the variable attenuator to compensate for a change in gain of the signal-processing module.

2. The invention of claim 1, wherein:
   the signal-processing module is an RF amplifier;
   the variable attenuator is a voltage-controlled attenuator; and
   the AGC circuit further comprises a passive attenuator adapted to attenuate the output signal sample prior to application to the switched detector circuitry.

3. The invention of claim 1, wherein the switched detector circuitry comprises:
   a first switch adapted to select either the input signal sample or the output signal sample; and
   a detector adapted to detect the selected sample from the first switch.

4. The invention of claim 3, wherein the switched detector circuitry further comprises:
   a second switch connected to receive the detected sample from the detector; and
   first and second sample-and-hold (S&H) circuits connected to receive signals from the second switch and provide signals to the processor, wherein the second switch is adapted to provide the detected sample to one of the first and second S&H circuits, wherein:
      the first and second switches are synchronized to selectively provide the detected input signal sample to the first S&H circuit and the detected output signal sample to the second S&H circuit.

5. The invention of claim 3, wherein the switched detector circuitry further comprises:
   a series input switch connected to apply the input signal sample to the first switch; and
   a series output switch connected to apply the output signal sample to the first switch, wherein the series input and output switches provide additional isolation between the input and output signal samples.

6. The invention of claim 3, wherein:
   the first switch is further adapted to select a sample of a reflected signal from a load connected to an output of the AGC circuit for detection by the detector; and
   the processor is further adapted to monitor the detected reflected signal from the load.

7. The invention of claim 1, wherein the AGC circuit further comprises a temperature sensor adapted to sense temperature of the signal-processing module, wherein the processor is adapted to control the variable attenuator based on the sensed temperature from the temperature sensor.

8. The invention of claim 1, wherein the signal-processing module is part of the AGC circuit.

9. The invention of claim 1, wherein:
   the signal-processing module is an RF amplifier;
   the variable attenuator is a voltage-controlled attenuator;
   the AGC circuit further comprises a passive attenuator adapted to attenuate the output signal sample prior to application to the switched detector circuitry; and
   the switched detector circuitry comprises:
      a first switch adapted to select either the input signal sample or the output signal sample; and
      a detector adapted to detect the selected sample from the first switch.

10. The invention of claim 9, wherein the switched detector circuitry further comprises:
    a second switch connected to receive the detected sample from the detector; and
    first and second sample-and-hold (S&H) circuits connected to receive signals from the second switch and provide signals to the processor, wherein the second switch is adapted to provide the detected sample to one of the first and second S&H circuits, wherein:
       the first and second switches are synchronized to selectively provide the detected input signal sample to the first S&H circuit and the detected output signal sample to the second S&H circuit.

11. The invention of claim 9, wherein the AGC circuit further comprises a temperature sensor adapted to sense temperature of the signal-processing module, wherein the processor is adapted to control the variable attenuator based on the sensed temperature from the temperature sensor.

12. The invention of claim 9, wherein the signal-processing module is part of the AGC circuit.

13. The invention of claim 1, wherein:
    the switched detector circuitry is further adapted to selectively detect a sample of a reflected signal from a load connected to an output of the AGC circuit; and
    the processor is further adapted to monitor the reflected signal from the load.

14. The invention of claim 13, the AGC circuit further comprises:
    a sampling device adapted to sample the reflected signal from the load; and
    a passive attenuator adapted attenuate the reflected signal sample prior to application to the switched detector circuitry.

15. The invention of claim 14, wherein the sampling device is a directional coupler.

16. The invention of claim 14, wherein the sampling device is a circulator.

17. The invention of claim 1, wherein:
    the signal-processing module is an RF amplifier;
    the variable attenuator is a voltage-controlled attenuator;
    the AGC circuit further comprises:
       a first passive attenuator adapted to attenuate the output signal sample prior to application to the switched detector circuitry;
       a sampling device adapted to sample the reflected signal from the load, wherein the sampling device is a directional coupler or a circulator; and
       a second passive attenuator adapted attenuate the reflected signal sample prior to application to the switched detector circuitry; and
    the switched detector circuitry comprises:
       a first switch adapted to select either the input signal sample, the output signal sample, or a sample of a reflected signal from a load connected to an output of the AGC circuit for detection by the detector;

a detector adapted to detect the selected sample from the first switch and monitor the detected reflected signal from the load;

a second switch connected to receive the detected sample from the detector;

first, second, and third sample-and-hold (S&H) circuits connected to receive signals from the second switch and provide signals to the processor, wherein the second switch is adapted to provide the detected sample to one of the first, second, and third S&H circuits, wherein:

the first and second switches are synchronized to selectively provide the detected input signal sample to the first S&H circuit, the detected output signal sample to the second S&H circuit, and the detected reflected signal sample to the third S&H circuit;

a series input switch connected to apply the input signal sample to the first switch; and a series output switch connected to apply the output signal sample to the first switch, wherein the series input and output switches provide additional isolation between the input and output signal samples.

18. The invention of claim 17, wherein the AGC circuit further comprises a temperature sensor adapted to sense temperature of the signal-processing module, wherein the processor is adapted to control the variable attenuator based on the sensed temperature from the temperature sensor.

19. The invention of claim 17, wherein the signal-processing module is part of the AGC circuit.

20. An integrated circuit having an AGC circuit for a signal-processing module, the AGC circuit comprising:

a variable attenuator adapted to attenuate an input signal and apply the attenuated input signal to the signal-processing module, which generates an output signal;

switched detector circuitry adapted to selectively detect either a sample of the input signal or a sample of the output signal; and a processor adapted to generate a control signal based on the detected input signal sample and the detected output signal sample, wherein the control signal adjusts the attenuation of the variable attenuator to compensate for a change in gain of the signal-processing module.

* * * * *